(12) United States Patent
Murakami et al.

(10) Patent No.: US 11,075,312 B2
(45) Date of Patent: Jul. 27, 2021

(54) SOLAR CELL MODULE AND METHOD FOR MANUFACTURING SOLAR CELL MODULE

(71) Applicant: Panasonic Intellectual Property Management Co., Ltd., Osaka (JP)

(72) Inventors: Youhei Murakami, Osaka (JP); Haruhisa Hashimoto, Osaka (JP); Tasuku Ishiguro, Osaka (JP); Masahiro Iwata, Osaka (JP); Hiroyuki Kannou, Osaka (JP); Ryoji Naito, Osaka (JP); Kazuki Ohta, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 119 days.

(21) Appl. No.: 15/473,499

(22) Filed: Mar. 29, 2017

(65) Prior Publication Data

US 2017/0207357 A1      Jul. 20, 2017

Related U.S. Application Data

(63) Continuation of application No. PCT/JP2015/003371, filed on Jul. 3, 2015.

(30) Foreign Application Priority Data

Sep. 30, 2014   (JP) .............................. JP2014-201006

(51) Int. Cl.
*H01L 31/048* (2014.01)
*H01L 31/044* (2014.01)
(Continued)

(52) U.S. Cl.
CPC .... *H01L 31/0481* (2013.01); *H01L 31/02013* (2013.01); *H01L 31/044* (2014.12);
(Continued)

(58) Field of Classification Search
CPC ........... H01L 31/02013; H01L 31/0203; H01L 31/048; H01L 31/0481; H01L 31/0488;
(Continued)

(56) References Cited

U.S. PATENT DOCUMENTS 6,288,326 B1     9/2001   Hayashi et al.
2008/0295881 A1  12/2008  Nakajima et al.
(Continued)

FOREIGN PATENT DOCUMENTS

JP       2000-277780 A      10/2000
JP       2000277780 A   *   10/2000
(Continued)

OTHER PUBLICATIONS

Machine translation of JP-2000277780-A, Mizukami et al. (Year: 2000).*

(Continued)

*Primary Examiner* — Mayla Gonzalez Ramos
(74) *Attorney, Agent, or Firm* — McDermott Will & Emery LLP

(57) ABSTRACT

A solar cell module includes solar cells having main surfaces to which inter-cell wiring members are connected, and an insulating member disposed on the main surfaces and the wiring members, and a first lead-out wire provided to the insulating member. The insulating member includes a first insulating layer formed of polyester resin, a second insulating layer formed of polyolefin or EVA and provided between the first insulating layer and the lead-out wires, and a third insulating layer formed of polyolefin or EVA and provided between the first insulating layer and the main surfaces. The third insulating layer has a thickness in a direction perpendicular to the main surfaces larger than a thickness of the second insulating layer.

10 Claims, 8 Drawing Sheets

(51) Int. Cl.
*H01L 31/18* (2006.01)
*H01L 31/02* (2006.01)

(52) U.S. Cl.
CPC ............ *H01L 31/048* (2013.01); *H01L 31/18* (2013.01); *H01L 31/186* (2013.01); *Y02E 10/50* (2013.01)

(58) Field of Classification Search
CPC ... H01L 31/049; H01L 31/0516; H01L 31/18; H01L 51/5253
See application file for complete search history.

(56) References Cited

U.S. PATENT DOCUMENTS

2009/0014060 A1* 1/2009 Nakatani ............... H01L 31/042
136/251
2014/0216548 A1* 8/2014 Maeda .................. H01L 31/048
136/259
2015/0144180 A1* 5/2015 Baccini ................. B32B 27/306
136/251

FOREIGN PATENT DOCUMENTS

| | | |
|---|---|---|
| JP | 2002-289895 A | 10/2002 |
| JP | 2006-210405 A | 8/2006 |
| JP | 2008-300449 A | 12/2008 |
| JP | 2009-021288 A | 1/2009 |
| JP | 2012-033545 A | 2/2012 |
| JP | 2012-070011 A | 4/2012 |

OTHER PUBLICATIONS

Search Report issued in corresponding International Patent Application No. PCT/JP2015/003371, dated Aug. 4, 2015.
Extended European Search Report issued in corresponding European Patent Application No. 15847028.6, dated Aug. 30, 2017.

* cited by examiner

200

SOLAR CELL MODULE AND METHOD FOR MANUFACTURING SOLAR CELL MODULE

RELATED APPLICATION

Priority is claimed to Japanese Patent Application No. 2014-201006, filed on Sep. 30, 2014, the entire content of which is incorporated herein by reference.

BACKGROUND OF THE INVENTION

Field of the Invention

The present invention relates to a solar cell module. Particularly, the present invention relates to a solar cell module including a wiring layer stacked to solar cells.

Description of the Related Art

A solar cell module includes a plurality of solar cells disposed therein. When lead-out wires are provided along a periphery of the plurality of solar cells, a non-power-generating area which does not contribute to power generation may be formed, which reduces an amount of power generation per unit area of the solar cell module. To improve the reduction in the amount of power generation per unit area, the lead-out wires are stacked to the solar cells.

SUMMARY OF THE INVENTION

In a case where solar cells and lead-out wires are stacked, an insulating sheet is inserted therebetween to prevent contacts between the lead-out wires and the tab wires provided to the solar cells. Insertion of the insulating sheet between the solar cells and the lead-out wires may cause pressure on the tab wires by the insulating sheet, which may result in local stress applied to the solar cells.

The present invention has been made in light of such a situation, and an object of the present invention is to provide a solar cell module with high reliability.

A solar cell module according to an aspect of the present invention includes solar cells having main surfaces to which wiring members are connected, and an insulating member disposed on the main surfaces and the wiring members, and lead-out wires disposed on the insulating member. The insulating member includes a first insulating layer formed of polyester resin, a second insulating layer formed of polyolefin or ethylene-vinyl acetate copolymer (EVA) and provided between the first insulating layer and the lead-out wires, and a third insulating layer formed of polyolefin or EVA and provided between the first insulating layer and the main surfaces. The third insulating layer has a thickness larger than that of the second insulating layer in a direction perpendicular to the main surfaces.

Another aspect of the present invention is a method for manufacturing a solar cell module. The method includes: stacking solar cells including main surfaces to which wiring members are connected, an insulating member disposed on the main surfaces and the wiring members, lead-out wires disposed on the insulating member, an encapsulant disposed on the lead-out wires, and a protecting member disposed on the encapsulant in the order mentioned; and laminating the members between the solar cells and the protecting member. The insulating member includes a first insulating layer formed of polyester resin, a second insulating layer formed of polyolefin or ethylene-vinyl acetate copolymer (EVA) and provided between the first insulating layer and the lead-out wires, and a third insulating layer formed of polyolefin or EVA and provided between the first insulating layer and the main surfaces. The third insulating layer has a thickness larger than that of the second insulating layer in a direction perpendicular to the main surfaces. The stacking includes disposing the insulating member between the main surfaces and the lead-out wires so that the third insulating layer is disposed in the main-surface side.

BRIEF DESCRIPTION OF THE DRAWINGS

Embodiments will now be described by way of examples only, with reference to the accompanying drawings which are meant to be exemplary, not limiting, and wherein like elements are numbered alike in several figures in which.

DETAILED DESCRIPTION

The invention will now be described by reference to the preferred embodiments. This does not intend to limit the scope of the present invention, but to exemplify the invention.

Before described in detail, the present invention will hereinafter be summarized. An embodiment of the present invention relates to a solar cell module provided with a plurality of solar cells disposed therein. In a main surface of each solar cell, tab wires are provided to connect adjacent solar cells. Furthermore, lead-out wires are stacked on the tab wires so that electric power generated in the plurality of solar cells can be taken to the outside. An insulating member is inserted between the tab wires and lead-out wires to prevent contacts therebetween. Furthermore, a protecting member is provided to cover the solar cells and the lead-out wires. An encapsulant seals the protecting member and the solar cells as well as the lead-out wires. Accordingly, the main surfaces of the solar cells are provided with the tab wires, insulating member, lead-out wires, encapsulant, and protecting member layered in the order mentioned.

In the present embodiment, the insulating member has a three-layered structure. In a middle of the three-layered structure, a first insulating layer formed of polyester resin is disposed, and a second insulating layer and third insulating layer are disposed to sandwich the first insulating layer. The first insulating layer and third insulating layer are formed of polyolefin or ethylene-vinyl acetate copolymer (EVA). The polyester resin forming the first insulating layer is a hard material and is excellent in strength. However, due to its high melting point, the polyester resin is hardly transformed during a lamination process and is insufficient in adhesiveness. To improve the adhesiveness, the second insulating layer and third insulating layer are applied. Accordingly, the second insulating layer and third insulating layer may be referred to adhesive layers.

In the laminated solar cell module, when the first insulating layer is in contact with the tab wires disposed on the main surfaces or when the first insulating layer is disposed in a vicinity of the tab wires, the first insulating layer having high strength presses the tab wires so that local stress may be applied to the solar cells under the tab wires. In the present embodiment, regarding the second insulating layer and third insulating layer sandwiching the first insulating layer, a thickness of the third insulating layer disposed in a solar cell side is larger than that of the second insulating layer disposed in a lead-out wire side. Making the thickness of the third insulating layer relatively large prevents the first insulating layer from being in contact with the tab wires so that the local stress may not be applied to the solar cells. Furthermore, making the thickness of the second insulating layer relatively small prevents the whole solar cell module from being thick.

Figure 1:
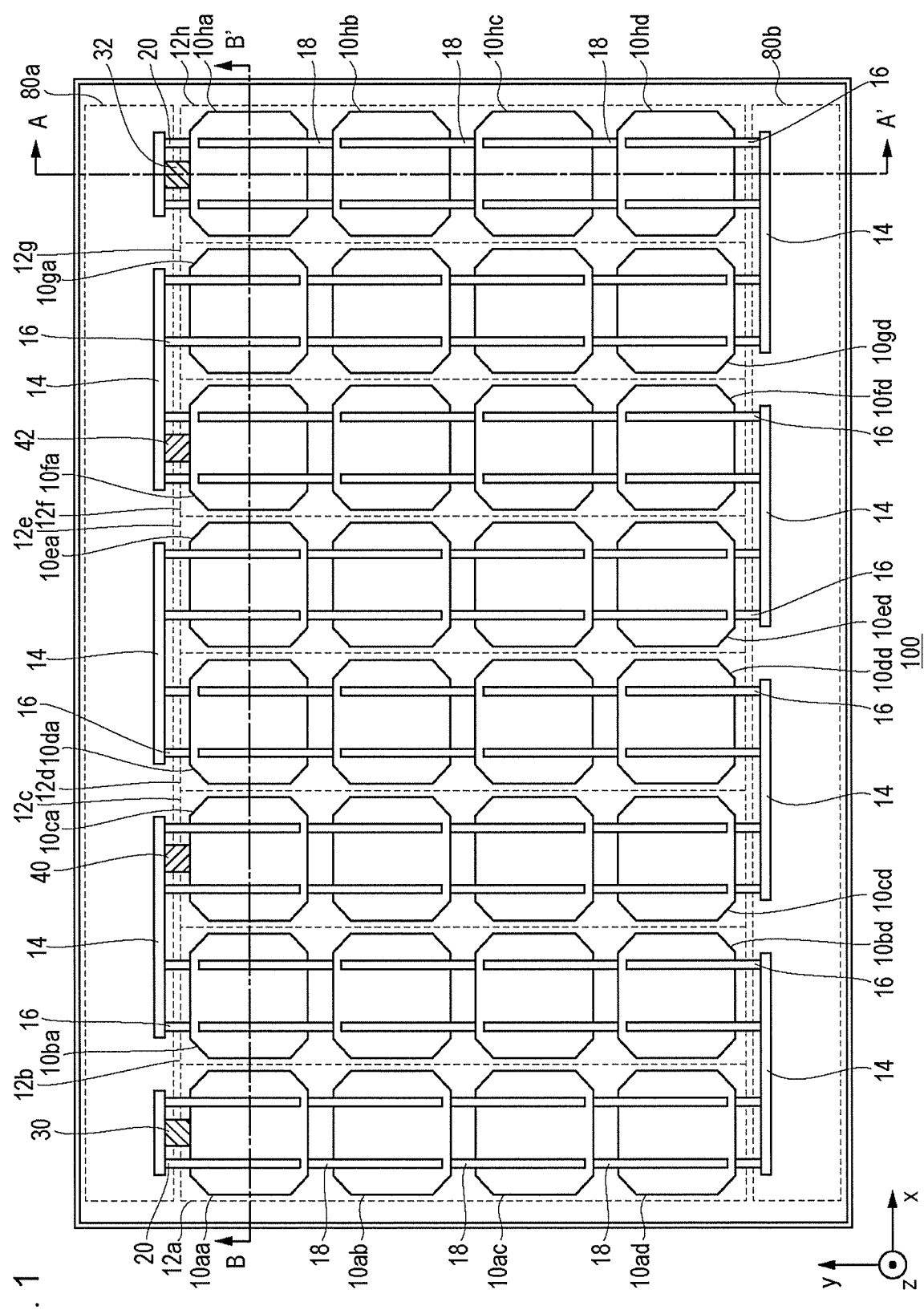
FIG. 1 is a plane view of a solar cell module according to an embodiment seen from a light-receiving-surface side.
Figure 2:
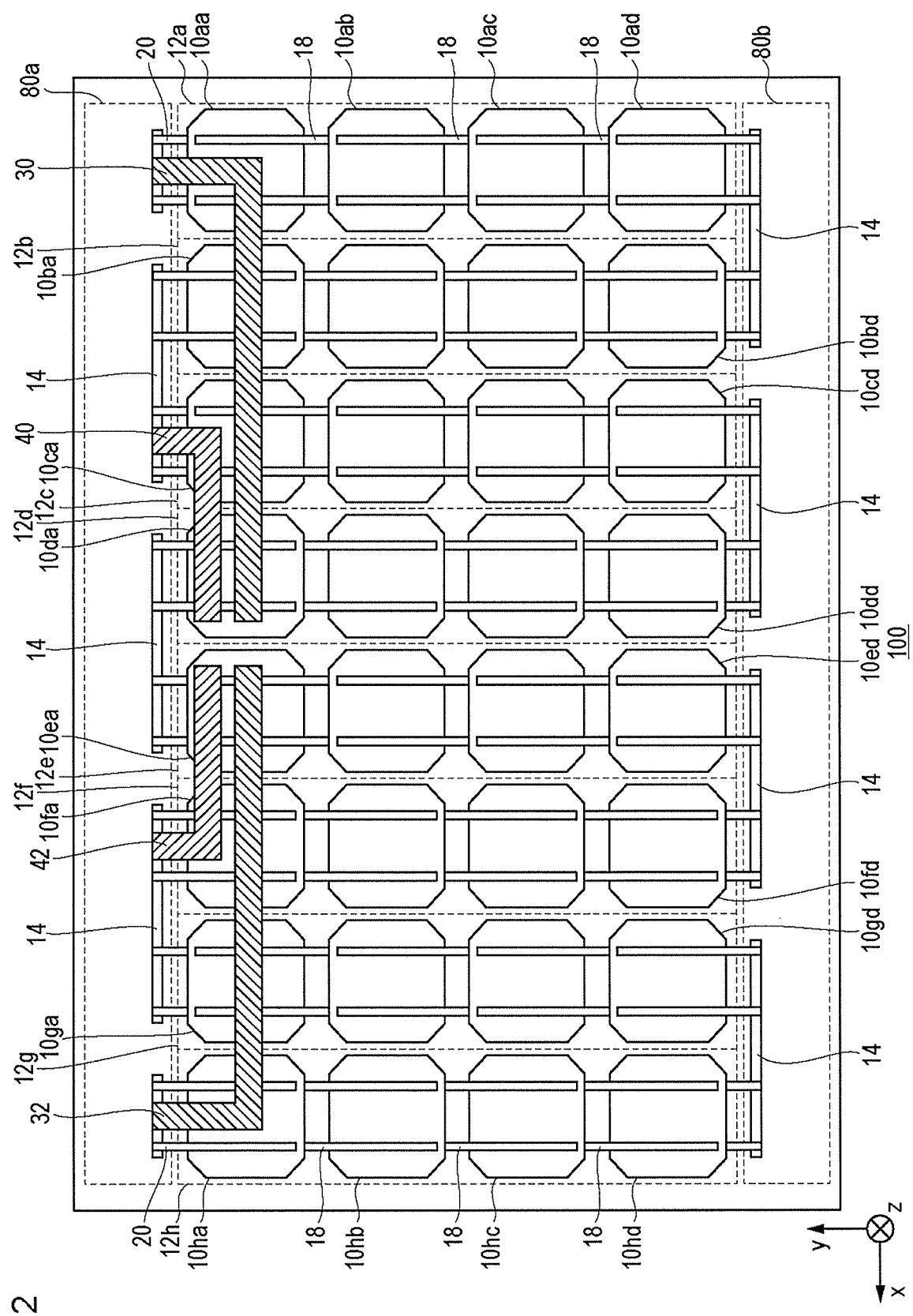
FIG. 2 is a plane view of the solar cell module illustrated in FIG. 1 seen from a back-surface side.

FIG. 1 is a plane view of a solar cell module 100 according to an embodiment of the present invention seen from a light-receiving-surface side. FIG. 2 is a place view of the solar cell module 100 seen from a back-surface side. As illustrated in FIG. 1, rectangular coordinates including an x-axis, y-axis, and z-axis are defined. The x-axis and y-axis are perpendicular to each other in the plane view of the solar cell module 100. The z-axis is perpendicular to the x-axis and y-axis and extends in a thickness direction of the solar cell module 100. Positive directions of the x-axis, y-axis, z-axis are defined by arrows in FIG. 1, and negative directions thereof are defined as directions opposing the arrows. Among two main surfaces included in the solar cell module 100 and parallel to an x-y plane, a main plane disposed in a positive direction side of the z-axis is a light receiving surface, and another main plane disposed in a negative direction side of the z-axis is a back surface. Hereinafter, the positive direction side of the z-axis is referred to the "light-receiving-surface side" and the negative direction side of the z-axis is referred to the "back-surface side".

The solar cell module 100 includes an eleventh solar cell 10aa, . . . , an eighty-fourth solar cell 10hd collectively called solar cells 10, inter-group wiring members 14, group-end wiring members 16, inter-cell wiring members 18, conductive members 20, a first lead-out wire 30 and a second lead-out wire 32 referred to lead-out wires, a first bypass diode connecting wire 40, and a second bypass diode connecting wire 42. A first non-power-generating area 80a and second non-power-generating area 80b are disposed to sandwich a plurality of solar cells 10 in the y-axis direction. Specifically, the first non-power-generating area 80a is disposed closer to the positive direction side of the y-axis than the plurality of solar cells 10, and the second non-power-generating area 80b is disposed closer to the negative direction side of the y-axis than the plurality of solar cells 10. Each of the first non-power-generating area 80a and second non-power-generating area 80b (hereinafter, those areas may be collectively referred to "non-power-generating areas 80") has a rectangular shape and does not include the solar cells 10.

Each of the plurality of solar cells 10 absorbs incident light and generates photovoltaic power. The solar cells 10 are formed of semiconductor materials such as crystalline silicon, gallium arsenide (GaAs) or indium phosphide (InP). A structure of each solar cell 10 should not be restricted. Herein, for example, crystalline silicon and amorphous silicon are stacked in each solar cell 10. Although omitted in FIG. 1 and FIG. 2, the light receiving surface and back surface of each solar cell 10 are provided with a plurality of finger electrodes extending parallel to each other in the x-axis direction and provided with a plurality of, for example, two busbar electrodes extending perpendicular to the plurality of finger electrodes in the y-axis direction. The busbar electrodes connect each of the plurality of finger electrodes.

The plurality of solar cells 10 is arranged in a matrix in the x-y plane. Herein, eight solar cells 10 are arranged in the x-axis direction and four solar cells 10 are arranged in the y-axis direction. The four solar cells 10 arranged in the y-axis direction are connected in series by the inter-cell wiring members 18 to form one solar cell group 12. For example, the eleventh solar cell 10aa, twelfth solar cell 10ab, thirteenth solar cell 10ac, and fourteenth solar cell 10ad are connected to form a first solar cell group 12a. Other solar cell groups 12, for example, from a second solar cell group 12b to eighth solar cell group 12h are formed similarly. Thus, eight solar cell groups 12 are arranged in parallel in the x-axis direction.

The inter-cell wiring members 18 connect a busbar electrode in one of the light-receiving-surface side and a busbar electrode in the other of the back-surface side among the adjacent solar cells 10 to form one solar cell group 12. For example, two inter-cell wiring members 18 used for connecting the eleventh solar cell 10aa and twelfth solar cell 10ab electrically connect a busbar electrode in the back-surface side of the eleventh solar cell 10aa and a busbar electrode in the light-receiving-surface side of the twelfth solar cell 10ab.

Three among seven inter-group wiring members 14 are disposed in the first non-power-generating area 80a and the remaining four are disposed in the second non-power-generating area 80b. Each of the seven inter-group wiring members 14 extends in the x-axis direction and is electrically connected to two solar cell groups 12 adjacent to each other through the group-end wiring members 16. For example, regarding the fourteenth solar cell 10ad disposed in a second non-power-generating area 80b side of the first solar cell group 12a and the twenty-fourth solar cell 10bd disposed in the second non-power-generating area 80b side of the second solar cell group 12b, they are electrically connected to one inter-group wiring member 14 through the group-end wiring members 16. Furthermore, the inter-group wiring members 14 are electrically connected to the first bypass diode connecting wire 40 and second bypass diode connecting wire 42. The first bypass diode connecting wire 40 and the second bypass diode connecting wire 42 will be described later.

The first solar cell group 12a and eighth solar cell group 12h disposed in both ends of the x-axis direction are connected to the conductive materials 20. The conductive materials 20 connected to the first solar cell group 12a extend from the light-receiving-surface side of the eleventh solar cell 10aa toward the first non-power-generating area 80a. The conductive materials 20 are connected to a pair of positive and negative first lead-out wire 30 and second lead-out wire 32 by a conductive adhesive such as solder. Therefore, the first lead-out wire 30 is electrically connected to the first solar cell group 12a through the conductive materials 20, and the second lead-out wire 32 is electrically connected to the eighth solar cell group 12h through the conductive materials 20.

The first lead-out wire 30 extends from a position where it is soldered to the conductive materials 20 toward the back-surface side of the eleventh solar cell 10aa. Furthermore, the first lead-out wire 30 extends in the negative direction of the y-axis in the back-surface side of the eleventh solar cell 10aa and then bends in the positive direction of the x-axis. In such manners, the first lead-out wire 30 is disposed in the back surfaces of the eleventh solar cell 10aa, twenty-first solar cell 10ba, thirty-first solar cell 10ca, and forty-first solar cell 10da along the x-axis. Herein, the first lead-out wire 30 is separated in the z-axis direction from the group-end wiring members 16 and inter-cell wiring members 18 provided to the back surfaces of the eleventh solar cell 10aa, twenty-first solar cell 10ba, thirty-first solar cell 10ca, and forty-first solar cell 10da. It should be noted that the group-end wiring members 16 and inter-cell wiring members 18 correspond to the abovementioned tab wires. The second lead-out wire 32 is similarly disposed with respect to the eighty-first solar cell 10ha, seventy-first solar cell 10ga, sixty-first solar cell 10fa, and fifty-first solar cell 10ea.

Hereinafter described are structures of the first bypass diode connecting wire 40 and second bypass diode connecting wire 42. Two group-end wiring members 16 extend from the back-surface side of the twenty-first solar cell 10ba in the second solar cell group 12b toward the first non-power-generating area 80a. Furthermore, another two group-end wiring members 16 extend from the light-receiving-surface side of the thirty-first solar cell 10ca in the third solar cell group 12c toward the first non-power-generating area 80a. The inter-group wiring member 14 is electrically connected to these four group-end wiring members 16 by the conductive adhesive such as solder. The first bypass diode connecting wire 40 is disposed between the two group-end wiring members 16 and is electrically connected to the inter-group wiring member 14 by the conductive adhesive such as solder.

The first bypass diode connecting wire 40 extends from a position where it is soldered to the inter-group wiring member 14 toward the back-surface side of the thirty-first solar cell 10ca. Furthermore, the first bypass diode connecting wire 40 extends in the negative direction of the y-axis in the back-surface side of the thirty-first solar cell 10ca and then bends in the positive direction of the x-axis. In such manners, the first bypass diode connecting wire 40 is disposed in the back-surface side of the thirty-first solar cell 10ca and forty-first solar cell 10da, parallel to the first lead-out wire 30 along the x-axis. Similar to the first lead-out wire 30, the first bypass diode connecting wire 40 is separated in the z-axis direction from the group-end wiring members 16 and inter-cell wiring members 18 provided to the back surfaces of the thirty-first solar cell 10ca and forty-first solar cell 10da. The second bypass diode connecting wire 42 is similarly disposed with respect to the sixty-first solar cell 10fa and fifty-first solar cell 10ea.

Figure 3:
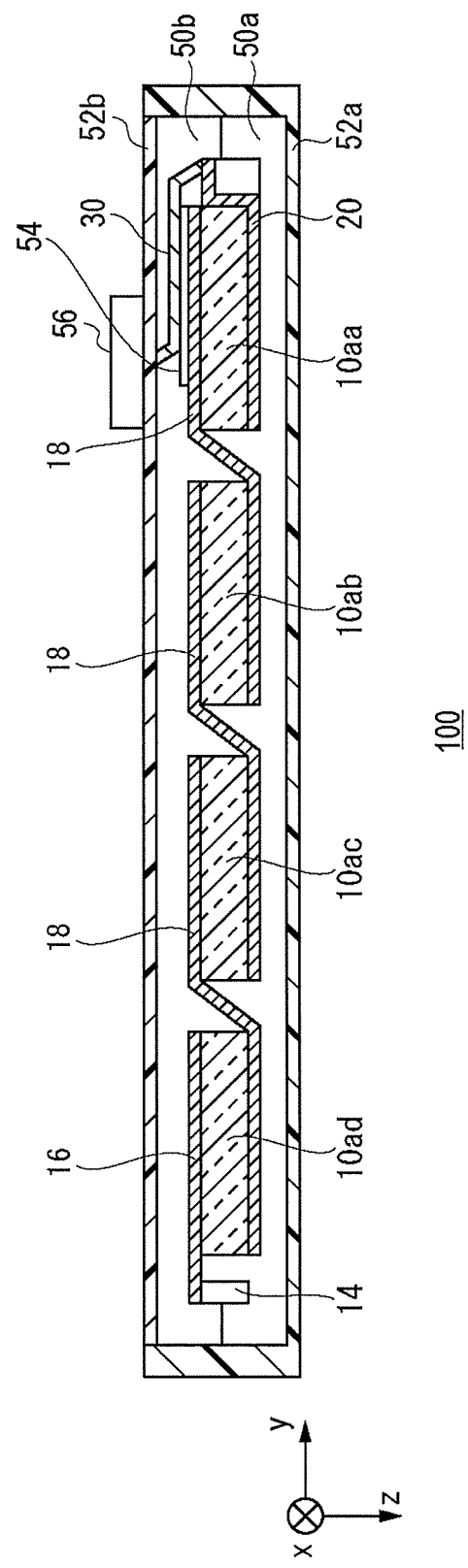
FIG. 3 is a cross sectional view of the solar cell module illustrated in FIG. 1 taken along a y-axis.

FIG. 3 is a cross sectional view of the solar cell module 100 taken along the y-axis and a line A-A' in FIG. 1. The solar cell module 100 includes the eleventh solar cell 10aa, twelfth solar cells 10ab, thirteenth solar cell 10ac, and fourteenth solar cell 10ad collectively called the solar cells 10, the inter-group wiring members 14, the group-end wiring members 16, the inter-cell wiring members 18, the conductive materials 20, a first encapsulant 50a and a second encapsulant 50b collectively referred to encapsulant 50, a first protecting member 52a and a second protecting member 52b collectively referred to protecting members 52, an insulating member 54, and a terminal box 56. An upper side of FIG. 3 corresponds to the back-surface side and a lower side thereof corresponds to the light-receiving-surface side.

The first protecting member 52a is disposed in the light-receiving-surface side of the solar cell module 100 and protects the light receiving surfaces of the solar cell module 100. Applicable examples of the first protecting member 52a include a translucent and impervious glass, and translucent plastic. The first protecting member 52a is formed in a rectangular shape. The first encapsulant 50a is stacked in the back-surface side of the first protecting member 52a. The first encapsulant 50a is disposed between the first protecting member 52a and the solar cells 10 and adheres them. An applicable example of the first encapsulant 50a includes thermoplastic resin like a resin film such as EVA, polyvinyl butyral (PVB), and polyimide. It should be noted that thermosetting resin is also applicable. The first encapsulant 50a is translucent and is formed by a rectangular sheet including a surface with a size substantially equal to that of the x-y plane in the first protecting member 52a.

The second encapsulant 50b is stacked in the back-surface side of the first encapsulant 50a. The second encapsulant 50b seals the plurality of solar cells 10, inter-cell wiring members 18, and the like disposed between the first encapsulant 50a and second encapsulant 50b. A material similar to the first encapsulant 50a may be used as the second encapsulant 50b. Furthermore, the second encapsulant 50b and first encapsulant 50a may be integrated by heating in a lamination and curing process.

The second protecting member 52b is stacked in the back-surface side of the second encapsulant 50b. The second protecting member 52b performing as back sheet protects the back-surface side of the solar cell module 100. An applicable example of the second protecting member 52b includes a stacked film having a structure in which resin films sandwich a resin film such as polyethylene terephthalate (PET) and aluminum (Al) foil. The second protecting member 52b is provided with an opening (not illustrated) penetrating the protecting member in the z-direction.

The terminal box 56 is formed in a cuboid shape and is adhered to the back-surface side of the second protecting member 52b by an adhesive such as silicone to cover the opening (not illustrated) of the second protecting member 52b. The pair of positive and negative first lead-out wire 30 and second lead-out wire 32, first bypass diode connecting wire 40, and second bypass diode connecting wire 42 are guided to a bypass diode (not illustrated) stored in the terminal box 56. Herein, the terminal box 56 is disposed in a position overlapping with the forty-first solar cell 10da and fifty-first solar cells 10ea upon the second protecting member 52b. A frame including aluminum (Al) and the like may be circumferentially attached to the solar cell module 100.

As mentioned above, the first lead-out wire 30 is separated in the z-axis direction from the inter-cell wiring members 18 provided to the back surface of the eleventh solar cell 10aa. In such a structure, to prevent contacts between the first lead-out wire 30 and inter-cell wiring members 18, the insulating member 54 is inserted therebetween. A structure of the insulating member 54 will be described later. It should be noted that, in FIG. 2, the insulating member 54 has a size of the x-y plane which can cover overlapping portions of the eleventh solar cell 10aa, twenty-first solar cell 10ba, thirty-first solar cell 10ca, forty-first solar cell 10da and the first lead-out wire 30 as well as overlapping portions of the abovementioned solar cells and the first bypass diode connecting wire 40. Furthermore, another insulating member 54 is inserted with respect to the second lead-out wire 32 and second bypass diode connecting wire 42 in FIG. 2. It should be noted that the insulating member 54 and another insulating member 54 may be integrated.

Figure 4:
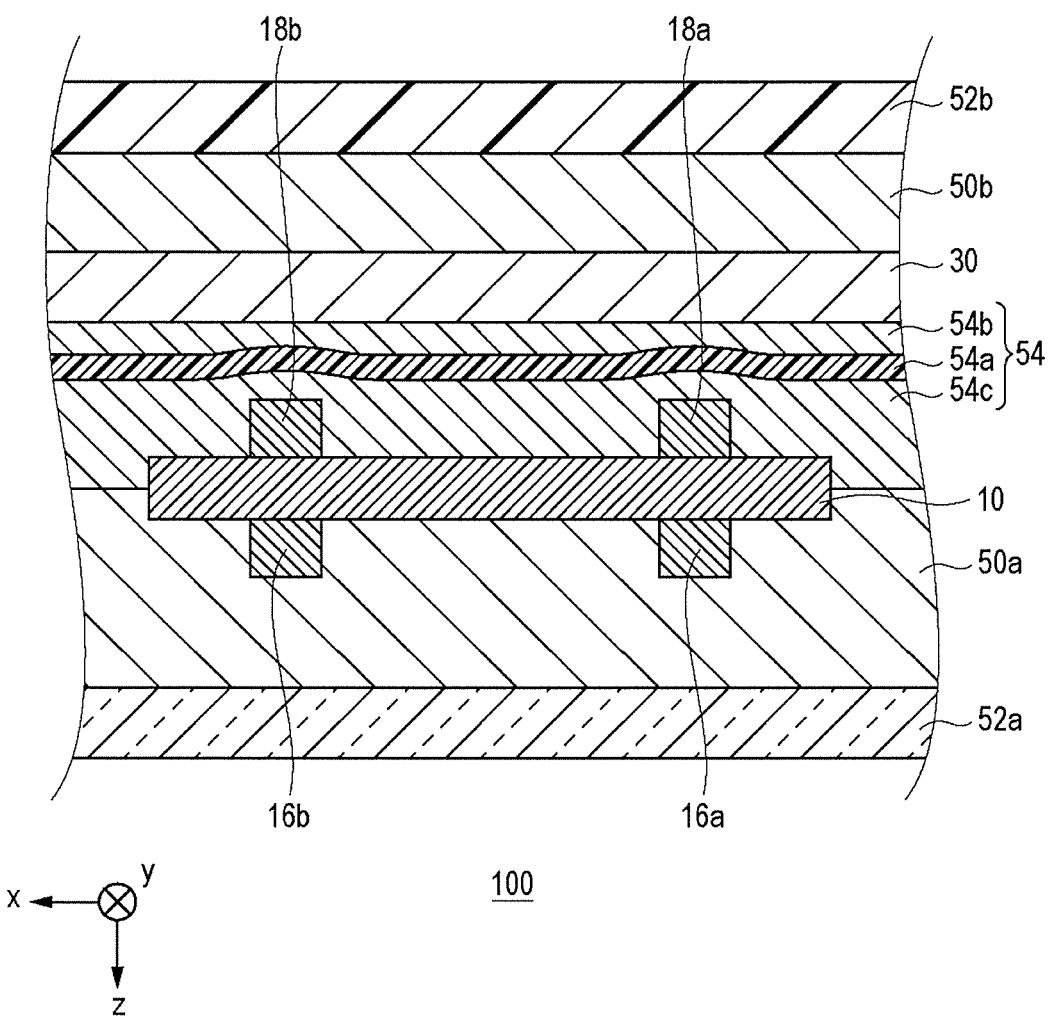
FIG. 4 is a partial cross sectional view of the solar cell module illustrated in FIG. 1 taken along an x-axis.

FIG. 4 is a partial cross sectional view of the solar cell module 100 taken along the x-axis and a line B-B' in FIG. 1. The solar cell module 100 includes the solar cells 10, a first group-end wiring member 16a and a second group-end wiring member 16b collectively referred to the group-end wiring members 16, a first inter-cell wiring member 18a and a second inter-cell wiring member 18b collectively referred to the inter-cell wiring members 18, the first encapsulant 50a and second encapsulant 50b collectively referred to the encapsulant 50, the first protecting member 52a and second protecting member 52b collectively referred to the protecting members 52, and the insulating member 54. The insulating member 54 includes a first insulating layer 54a, second insulating layer 54b, and third insulating layer 54c.

The group-end wiring members 16 are adhered to the light receiving surfaces of the solar cells 10 and are connected to the busbar electrode (not illustrated) upon the light receiving surfaces. Similarly, the inter-cell wiring members 18 are adhered to the back surfaces of the solar cells 10 and are connected to the busbar electrode (not illustrated) upon the back surfaces. The group-end wiring members 16 and inter-cell wiring members 18 are adhered to the main surfaces of the solar cells 10 by the adhesive layer obtained by hardening the resin adhesive. An applicable example of those wiring members includes a thermosetting resin material having adhesiveness such as epoxy resin, acrylic resin, and urethane resin.

The insulating member 54 includes three layers, that is, the first insulating layer 54a, second insulating layer 54b, and third insulating layer 54c stacked in the z-axis direction. The insulating member 54 is inserted between the solar cells 10 and the first lead-out wire 30. The third insulating layer 54c is disposed in a solar-cell 10 side, and the second insulating layer 54b is disposed in a first lead-out wire 30 side. Therefore, the third insulating layer 54c is stacked on the solar cells 10, the first insulating layer 54a is stacked on the third insulating layer 54c, and the second insulating layer 54b is stacked on the first insulating layer 54a.

The first insulating layer 54a is formed of polyester resin. An example of the polyester resin is PET. The second insulating layer 54b and third insulating layer 54c are formed of polyolefin resin or EVA. The second insulating layer 54b and third insulating layer 54c may be formed of a same material or different material.

The polyester resin is a hard material and is excellent in strength. However, due to its high melting point, the polyester resin is hardly transformed in the lamination process. Therefore, in a case where the first insulating layer 54a is solely inserted between the inter-cell wiring members 18 and the first lead-out wire 30, the inter-cell wiring members 18 and the first lead-out wire 30 are sufficiently insulated but insufficiently adhered. To improve the adhesiveness, the second insulating layer 54b and third insulating layer 54c are included in the insulating member 54 to be used to sandwich the first insulating layer 54a from both surfaces.

It is preferable that each insulating layer has a thickness thick enough to secure the insulation between the solar cells 10 and the first lead-out wire 30 and thin enough to make a thickness of the whole solar cell module 100 thin. Furthermore, it is preferable that the third insulating layer 54c has a thickness relatively thicker than the other insulating layers to avoid contact between the inter-cell wiring members 18 and the first insulating layer 54a. Regarding the thickness thick enough to avoid the contact between the inter-cell wiring members 18 and the first insulating layer 54a, the inventors have found that it is about half or more than the thickness of each inter-cell wiring member 18. Furthermore, by making the thickness of the third insulating layer 54c substantially equivalent to or more than that of each inter-cell wiring member 18, it is possible to reduce the influence of the first insulating layer 54a protruding toward the first lead-out wire 30 side above the inter-cell wiring members 18 during the lamination process. For example, in a case where each inter-cell wiring member 18 has a thickness ranging from about 200 μm to 300 μm, the third insulating layer 54c preferably has a thickness ranging from about 100 μm to 500 μm, and more preferably has a thickness ranging from about 200 μm to 300 μm.

On the other hand, the first insulating layer 54a preferably has a thickness ranging from about 30 μm to 200 μm, and more preferably has a thickness ranging from about 50 μm to 150 μm. The second insulating layer 54b preferably has a thickness ranging from about 30 μm to 150 μm, and more preferably has a thickness ranging from about 50 μm to 100 μm. Therefore, the thickness of the second insulating layer 54b is thinner than that of the third insulating layer 54c.

In such manners, by making the thickness of the third insulating layer 54c large to make a distance between the solar cells 10 and the first insulating layer 54a large, the first insulating layer 54a can be flatten along the first lead-out wire 30 having a flat shape. Accordingly, it is possible to prevent the influence of the first insulating layer 54a being in contact with the inter-cell wiring members 18 of the solar cells 10. Furthermore, by making the thickness of the third insulating layer 54c thin, it is possible to prevent an increase in the thickness of the whole insulating member 54.

In the abovementioned description, it should be noted that the first lead-out wire 30 may be the second lead-out wire 32, the first bypass diode connecting wire 40, or the second bypass diode connecting wire 42. Furthermore, the inter-cell wiring members 18 are disposed in the back-surface side and the group-end wiring members 16 are disposed in the light-receiving-surface side, but the group-end wiring members 16 and conductive materials 20 may be disposed in the back-surface side and the inter-cell wiring members 18 and conductive materials 20 may be disposed in the light-receiving-surface side.

Hereinafter, a method for manufacturing the solar cell module 100 will be described.

Figure 5:
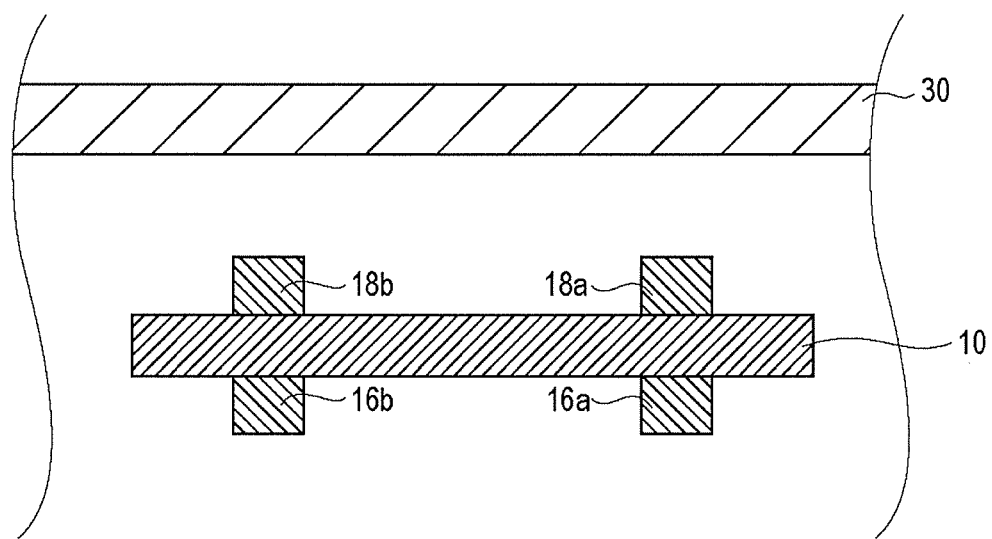
FIG. 5 is a view illustrating a first process of a method for manufacturing the solar cell module illustrated in FIG. 1.

FIG. 5 is a view illustrating a first process of the method for manufacturing the solar cell module 100. First, the solar cells 10 are prepared and the adhesive is applied to the surfaces of the solar cells 10 to adhere the inter-cell wiring members 18. Next, the inter-cell wiring members 18 are disposed on the busbar electrode and the adhesive is hardened by heating. Accordingly, the hardened adhesive becomes a resin layer and the inter-cell wiring members 18 are adhered to the back surfaces of the solar cells 10. Similarly, the group-end wiring members 16 are adhered to the light receiving surfaces of the solar cells 10. The first lead-out wire 30 is provided to the back-surface side of the solar cells 10.

Figure 6:
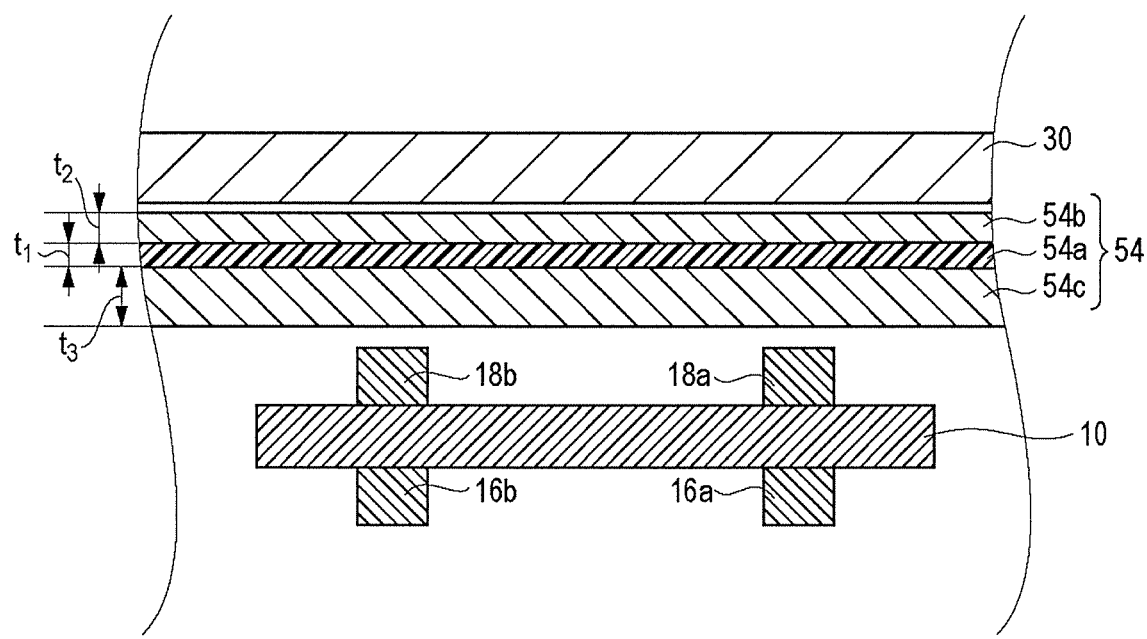
FIG. 6 is a view illustrating a second process of the method for manufacturing the solar cell module illustrated in FIG. 1.

FIG. 6 is a view illustrating a second process of the method for manufacturing the solar cell module 100. The insulating member 54 is inserted between the first lead-out wire 30 and the solar cells 10. Regarding the insulating member 54, the first insulating layer 54a has a thickness $t_1$ ranging from about 30 μm to 200 μm, the second insulating layer 54b has a thickness $t_2$ ranging from about 30 μm to 150 μm, and the third insulating layer 54c has a thickness $t_3$ ranging from about 100 μm to 500 μm. Furthermore, the thickness $t_3$ of the third insulating layer 54c is defined to be about 1.5 times to 3 times as thick as the thickness $t_2$ of the second insulating layer 54b. When providing the insulating member 54, the second insulating layer 54b is disposed to face the first lead-out wire 30 side and the third insulating layer 54c is disposed to face the solar-cell 10 side.

Figure 7:
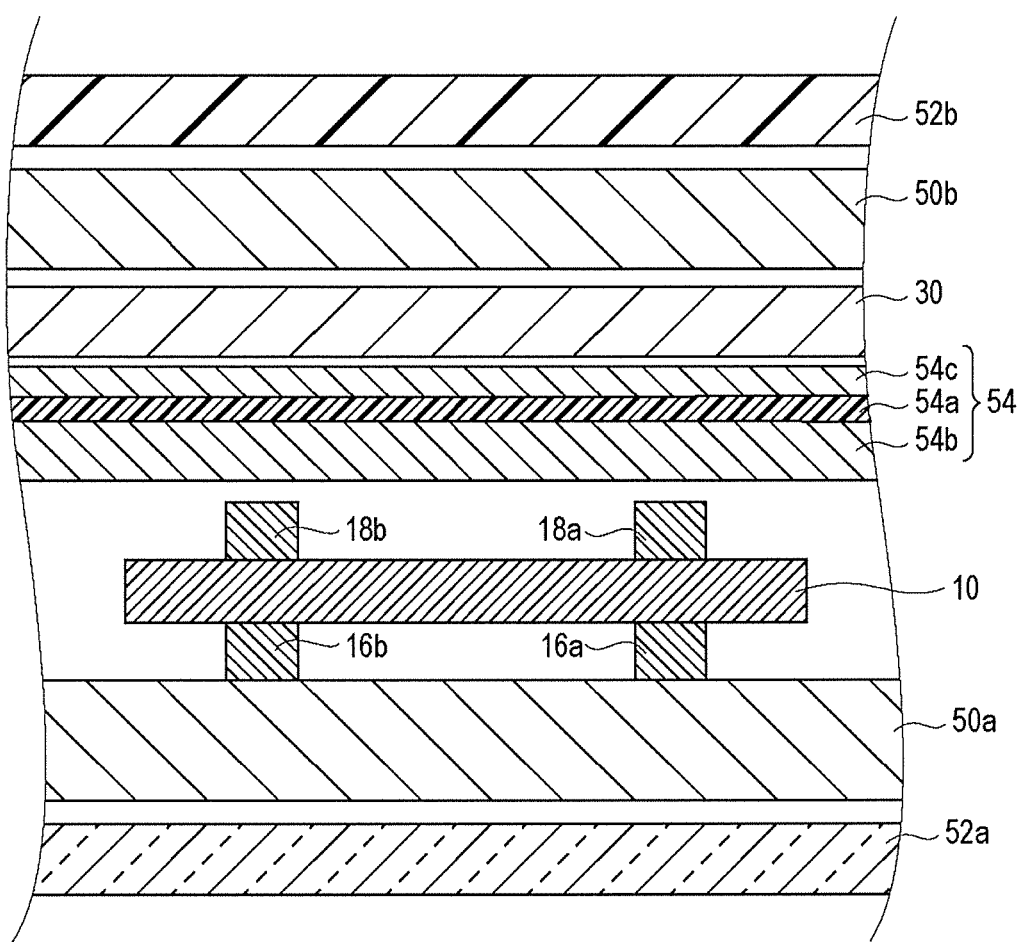
FIG. 7 is a view illustrating a third process of the method for manufacturing the solar cell module illustrated in FIG. 1.

FIG. 7 is a view illustrating a third process of the method for manufacturing the solar cell module 100. The second encapsulant 50b is layered in the back-surface side of the first lead-out wire 30. Furthermore, the second protecting member 52b is layered in the back-surface side of the second encapsulant 50b. Similarly, the first encapsulant 50a and first protecting member 52a are also stacked in the light-receiving-surface side of the solar cells 10 to form a stacked structure.

Consequently, the lamination and curing process is carried out with respect to the stacked structure. In this process, by pressuring the stacked structure under reduced pressure, the air inside the stacked structure is deflated and the stacked structure is heated so that the stacked structure is integrated. As mentioned above, during vacuum laminating in the lamination and curing process, a temperature is set at about 150° C. Furthermore, the terminal box 56 is attached to the second protecting member 52b by the adhesive. Accordingly, the solar cell module 100 illustrated in FIG. 4 can be completely manufactured.

Figure 8:
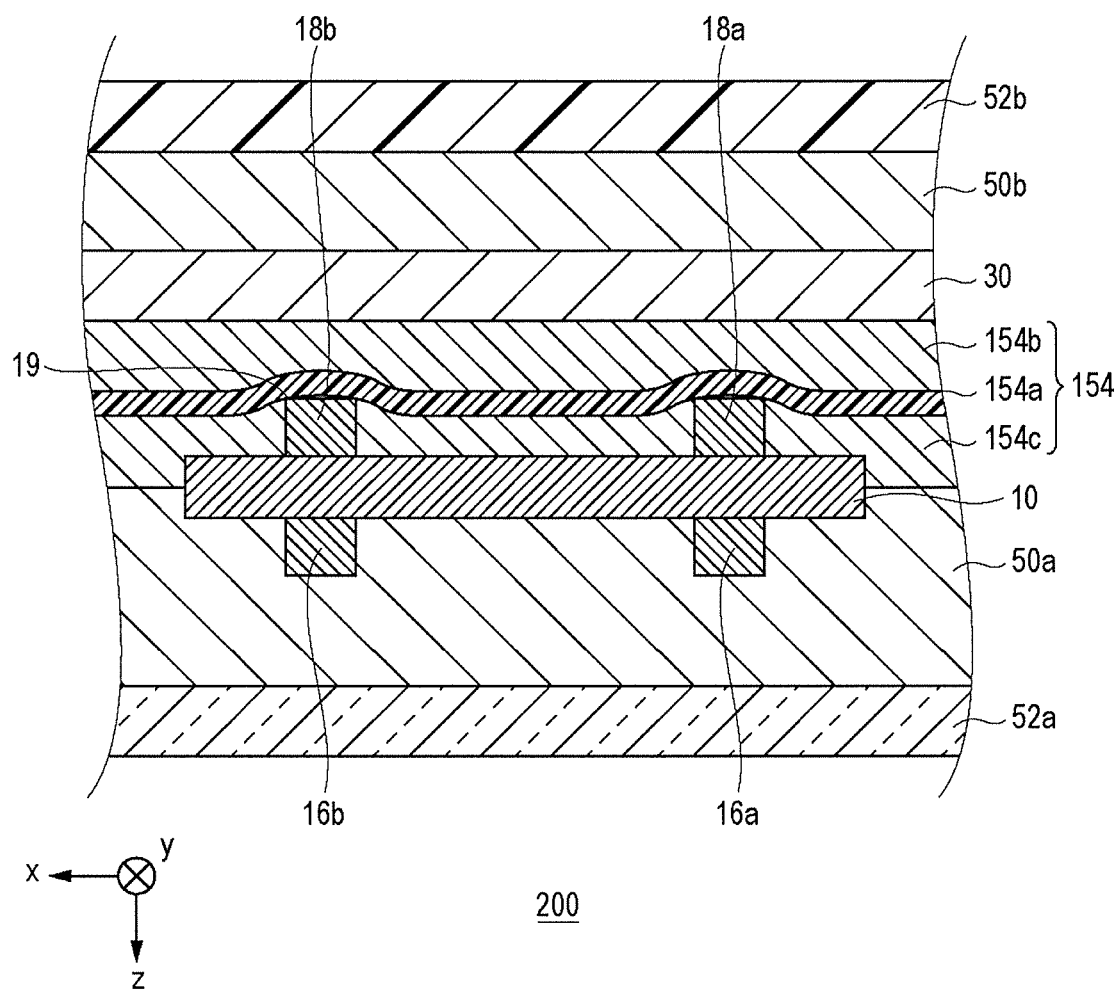
FIG. 8 is a partial cross sectional view of a solar cell module according to a comparative example.

FIG. 8 is a partial cross sectional view of a solar cell module 200 according to comparative example, corresponding to the partial cross sectional view illustrated in FIG. 4. Comparative example differs from the abovementioned embodiment in terms of a ratio of thicknesses of a first insulating layer 154a, second insulating layer 154b, and third insulating layer 154c included in an insulating member 154. In comparative example, a thickness of the third insulating layer 154c is small so that corners 19 of inter-cell wiring members 18 are in contact with the first insulating layer 154a and the first insulating layer 154a presses the corners 19. Accordingly, local stress may be applied just below the inter-cell wiring members 18, which may cause damages on solar cells 10. Furthermore, the second insulating layer 154b has a large thickness so that the inter-cell wiring members 18 influentially transform the first insulating layer 154a and the first insulating layer 154a protrudes toward a first lead-out wire 30 at positions corresponding to the inter-cell wiring members 18. Thus, a thickness of the whole insulating member 154 becomes large.

On the other hand, according to the present embodiment, the third insulating layer 54c which is to be adhered to the solar cells 10 has the thickness relatively large so that it is possible to reduce the influence of the first insulating layer 54a with high intensity pressing the inter-cell wiring members 18. More specifically, by making the thickness of the third insulating layer 54c large, it is possible to prevent transformation of the first insulating layer 54a due to the influence of the inter-cell wiring members 18 during the lamination process, and it is possible to flatten the first insulating layer 54a along the first lead-out wire 30. Accordingly, it is possible to make the third insulating layer 54c perform as buffer layer and to reduce the stress which is to be locally applied to the solar cells 10. Therefore, according to the present embodiment, it is possible to achieve the solar cell module 100 having high reliability.

Furthermore, according to the present embodiment, by making the thickness of the second insulating layer 54b which is to be adhered to the first lead-out wire 30 relatively small, it is possible to prevent the increase in the thickness of the whole insulating member 54. Accordingly, a slim-type solar cell module 100 can be achieved.

According to the present embodiment, in the back-surfaces of the solar cells 10, the first lead-out wire 30 and second lead-out wire 32 used for taking electricity out of the solar cell module 100 extend in a direction along the back surfaces, separated from the back surfaces. In other words, the first lead-out wire 30 and second lead-out wire 32 can be provided, avoiding the non-power-generating area 80. Therefore, it is possible to reduce a relative area of the non-power-generating area 80 accounting for of the whole solar cell module 100 and to improve a decrease in an amount of power generation per unit area.

The present invention has been described based on the abovementioned embodiment. Embodiment herein is for illustration purpose and it is obvious to those skilled in the art that each configurational element or combination of each process can be modified variously and that such modifications are also within the range of the present invention.

A summary of the present embodiment is as follows. A solar cell module 100 according to an aspect of the present invention includes the solar cells 10 having the main surfaces to which the wiring members (group-end wiring members 16, the inter-cell wiring members 18) are connected, the insulating member 54 disposed on the main surfaces and wiring members, the lead-out wires (first lead-out wire 30, second lead-out wire 32) disposed on the insulating member 54. The insulating member 54 includes the first insulating layer 54a formed of polyester resin, the second insulating layer 54b formed of polyolefin or EVA and provided between the first insulating layer 54a and the lead-out wires, and the third insulating layer 54c formed of polyolefin or EVA and provided between the first insulating layer 54a and the main surfaces. The third insulating layer 54c has the thickness in the direction perpendicular to the main surfaces larger than that of the second insulating layer 54b.

Regarding the third insulating layer 54c, the thickness in the direction perpendicular to the main surface may be 3/2 times or more as thick as the thickness of the second insulating layer 54b.

Regarding the third insulating layer 54c, the thickness in the direction perpendicular to the main surfaces may be half or more of the thickness of the wiring member.

The lead-out wires may be disposed away from the main surfaces, extending in a direction parallel to the main surfaces.

Another aspect of the present invention is a method for manufacturing the solar cell module 100. The method includes: stacking the solar cells 10 including the main surfaces to which the wiring members (group-end wiring members 16, inter-cell wiring members 18) are connected, the insulating member 54 disposed on the main surfaces and wiring members, the lead-out wires (first lead-out wire 30, second lead-out wire 32) disposed on the insulating member 54, the encapsulant (second encapsulant 50b) disposed on the lead-out wires, and the protecting member (second protecting member 52b) disposed on the encapsulant in the order mentioned; and laminating the members between the solar cells 10 and the protecting member. The insulating member 54 includes the first insulating layer 54a formed of polyester resin, the second insulating layer 54b formed of polyolefin or ethylene-vinyl acetate copolymer (EVA) and provided between the first insulating layer 54a and the lead-out wires, and the third insulating layer 54c formed of polyolefin or EVA and provided between the first insulating layer 54a and the main surfaces. The third insulating layer 54c has the thickness in the direction perpendicular to the main surfaces larger than the thickness of the second insulating layer 54b. The stacking includes disposing the insulating member 54 between the main surfaces and the lead-out wires so that the third insulating layer 54c is disposed in the main-surface side.

It should be understood that the invention is not limited to the above-described embodiments and modifications, but may be further modified into various forms on the basis of the spirit of the invention. Additionally, those modifications are included in the scope of the invention.

What is claimed is:

1. A solar cell module comprising:
a solar cell including a main surface;
a wiring member connected to the main surface;
an insulating member disposed on the main surface and the wiring member;
a lead-out wire disposed on the insulating member; and
a protecting member having an opening to which a terminal box for an external connection of the lead-out wire is attached,
wherein the solar cell, the wiring member, the insulating member, the lead-out wire, and the protecting member are stacked in the order mentioned,
wherein the insulating member includes:
a first insulating layer formed of polyester resin;
a second insulating layer formed of polyolefin or ethylene-vinyl acetate copolymer (EVA) and provided between the first insulating layer and the lead-out wire; and
a third insulating layer formed of polyolefin or EVA and provided between the first insulating layer and the main surface, the third insulating layer having a thickness in a direction perpendicular to the main surface larger than a thickness of the second insulating layer, and
wherein the first insulating layer, the second insulating layer, and the third insulating layer are arranged without intersecting with the lead-out wire.

2. The solar cell module according to claim 1, wherein the thickness of the third insulating layer in the direction perpendicular to the main surface is 3/2 times or more as thick as the thickness of the second insulating layer.

3. The solar cell module according to claim 1, wherein the thickness of the third insulating layer in the direction perpendicular to the main surface is half or more of the thickness of the wiring member.

4. The solar cell module according to claim 1, wherein the lead-out wire is disposed away from the main surface, extending in a direction parallel to the main surface.

5. A manufacturing method of solar cell module, comprising:
stacking:
1) a solar cell including a main surface;
2) a wiring member connected to the main surface;
3) an insulating member disposed on the main surface and the wiring member;
4) a lead-out wire disposed on the insulating member;
5) an encapsulant disposed on the lead-out wire; and
6) a protecting member disposed on the encapsulant and having an opening to which a terminal box for an external connection of the lead-out is attached, in the order mentioned; and
laminating the members between the solar cell and protecting member,
wherein the insulating member includes a first insulating layer formed of polyester resin, a second insulating layer formed of polyolefin or ethylene-vinyl acetate copolymer (EVA) and provided between the first insulating layer and the lead-out wire, and a third insulating layer formed of polyolefin or EVA and provided between the first insulating layer and the main surface,
wherein the third insulating layer having a thickness in a direction perpendicular to the main surface larger than a thickness of the second insulating layer,
wherein the stacking includes disposing the insulating member between the main surface and the lead-out wire so that the third insulating layer is disposed in a main-surface side, and
wherein the first insulating layer, the second insulating layer, and the third insulating layer are arranged without intersecting with the lead-out wire.

6. The solar cell module according to claim 1, wherein the protecting member is disposed on entirety of an encapsulant.

7. The manufacturing method according to claim 5, wherein the stacking includes disposing the protecting member on entirety of the encapsulant.

8. The solar cell module according to claim 1, wherein an entirety of a perimeter of the opening is formed of the protecting member.

9. The manufacturing method of the solar cell module according to claim 5, wherein an entirety of a perimeter of the opening is formed of the protecting member.

10. A solar cell module comprising:
a solar cell including a main surface;
a wiring member connected to the main surface;
an insulating member disposed on the main surface and the wiring member;
a lead-out wire disposed on the insulating member; and
a protecting member having an opening to which a terminal box for an external connection of the lead-out wire is attached,
wherein the solar cell, the wiring member, the insulating member, the lead-out wire, and the protecting member are stacked in the order mentioned,
wherein the insulating member includes:
a first insulating layer formed of polyester resin;
a second insulating layer formed of polyolefin or ethylene-vinyl acetate copolymer (EVA) and provided between the first insulating layer and the lead-out wire; and
a third insulating layer formed of polyolefin or EVA and provided between the first insulating layer and the main surface, the third insulating layer having a thickness in a direction perpendicular to the main surface larger than a thickness of the second insulating layer, and
wherein the first insulating layer, the second insulating layer, and the third insulating layer are arranged except between the lead-out wire and the protecting member.

* * * * *